United States Patent
Khlat et al.

(10) Patent No.: US 8,792,840 B2
(45) Date of Patent: Jul. 29, 2014

(54) MODIFIED SWITCHING RIPPLE FOR ENVELOPE TRACKING SYSTEM

(75) Inventors: Nadim Khlat, Cugnaux (FR); Michael R. Kay, Summerfield, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 28 days.

(21) Appl. No.: 13/550,049

(22) Filed: Jul. 16, 2012

(65) Prior Publication Data

US 2013/0183916 A1    Jul. 18, 2013

Related U.S. Application Data

(60) Provisional application No. 61/508,202, filed on Jul. 15, 2011.

(51) Int. Cl.
| | |
|---|---|
| *H04B 1/04* | (2006.01) |
| *H03F 1/02* | (2006.01) |
| *H03F 1/30* | (2006.01) |

(52) U.S. Cl.
CPC ............ *H04B 1/0475* (2013.01); *H03F 1/0227* (2013.01); *H03F 1/305* (2013.01)
USPC ........................................ 455/127.1; 375/297

(58) Field of Classification Search
CPC .... H04B 1/005; H04B 1/0475; H04B 15/005; H04B 15/02; H03F 1/08; H03F 1/0222; H03F 1/305
USPC ............ 455/73, 91, 115.1, 126, 127.1–127.4; 375/295, 296; 330/296, 297
See application file for complete search history.

(56) References Cited

U.S. PATENT DOCUMENTS

| 3,969,682 A | 7/1976 | Rossum |
| 3,980,964 A | 9/1976 | Grodinsky |
| 4,587,552 A | 5/1986 | Chin |
| 4,692,889 A | 9/1987 | McNeely |
| 4,996,500 A | 2/1991 | Larson et al. |

(Continued)

FOREIGN PATENT DOCUMENTS

| EP | 0755121 A2 | 1/1997 |
| EP | 1492227 A1 | 12/2004 |

(Continued)

OTHER PUBLICATIONS

Dixon, N., "Standardization boosts momentum for Envelope tracking," Microwave Engineers, Europe, Apr. 20, 2011, 2 pages.

(Continued)

*Primary Examiner* — Thanh Le
(74) *Attorney, Agent, or Firm* — Withrow & Terranova, P.L.L.C.

(57) ABSTRACT

Radio frequency (RF) transmitter circuitry, which includes an RF power amplifier (PA) and an envelope tracking power supply, is disclosed. The RF PA receives and amplifies an RF input signal to provide an RF transmit signal using an envelope power supply signal. The envelope tracking power supply provides the envelope power supply signal, which has switching ripple. Further, the envelope tracking power supply operates in either a normal switching ripple mode or a modified switching ripple mode, such that during the normal switching ripple mode, the envelope power supply signal has normal switching ripple, and during the modified switching ripple mode, the envelope power supply signal has modified switching ripple. When the modified switching ripple is required, the envelope tracking power supply operates in the modified switching ripple mode.

20 Claims, 10 Drawing Sheets

(56) References Cited

U.S. PATENT DOCUMENTS

| | | |
|---|---|---|
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,486,871 A | 1/1996 | Filliman et al. |
| 5,532,916 A | 7/1996 | Tamagawa |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,483,281 B2 | 11/2002 | Hwang |
| 6,559,689 B1 | 5/2003 | Clark |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,728,163 B2 | 4/2004 | Gomm et al. |
| 6,819,938 B2 | 11/2004 | Sahota |
| 6,958,596 B1 | 10/2005 | Sferrazza et al. |
| 6,995,995 B2 | 2/2006 | Zeng et al. |
| 7,058,373 B2 | 6/2006 | Grigore |
| 7,164,893 B2 | 1/2007 | Leizerovich et al. |
| 7,200,365 B2 | 4/2007 | Watanabe et al. |
| 7,233,130 B1 | 6/2007 | Kay |
| 7,279,875 B2 | 10/2007 | Gan et al. |
| 7,394,233 B1 | 7/2008 | Trayling et al. |
| 7,405,618 B2 | 7/2008 | Lee et al. |
| 7,411,316 B2 | 8/2008 | Pai |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,696,735 B2 | 4/2010 | Oraw et al. |
| 7,715,811 B2 | 5/2010 | Kenington |
| 7,724,837 B2 | 5/2010 | Filimonov et al. |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,659,355 B2 | 2/2014 | Henshaw et al. |
| 2002/0071497 A1 | 6/2002 | Bengtsson et al. |
| 2003/0017286 A1 | 1/2003 | Williams et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0124913 A1 | 7/2004 | Midya et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0093630 A1 | 5/2005 | Whittaker et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2006/0006946 A1 | 1/2006 | Burns et al. |
| 2006/0097711 A1 | 5/2006 | Brandt |
| 2006/0128324 A1 | 6/2006 | Tan et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0014382 A1 | 1/2007 | Shakeshaft et al. |
| 2007/0024360 A1 | 2/2007 | Markowski |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0259628 A1 | 11/2007 | Carmel et al. |
| 2008/0003950 A1* | 1/2008 | Haapoja et al. .................. 455/73 |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |

(56) References Cited

U.S. PATENT DOCUMENTS

| | | | |
|---|---|---|---|
| 2008/0280577 | A1 | 11/2008 | Beukema et al. |
| 2009/0004981 | A1 | 1/2009 | Eliezer et al. |
| 2009/0097591 | A1 | 4/2009 | Kim |
| 2009/0167260 | A1 | 7/2009 | Pauritsch et al. |
| 2009/0174466 | A1 | 7/2009 | Hsieh et al. |
| 2009/0184764 | A1 | 7/2009 | Markowski et al. |
| 2009/0190699 | A1 | 7/2009 | Kazakevich et al. |
| 2009/0218995 | A1 | 9/2009 | Ahn |
| 2009/0289720 | A1 | 11/2009 | Takinami et al. |
| 2009/0319065 | A1 | 12/2009 | Risbo |
| 2010/0017553 | A1 | 1/2010 | Laurencin et al. |
| 2010/0045247 | A1 | 2/2010 | Blanken et al. |
| 2010/0171553 | A1 | 7/2010 | Okubo et al. |
| 2010/0253309 | A1 | 10/2010 | Xi et al. |
| 2010/0266066 | A1 | 10/2010 | Takahashi |
| 2010/0301947 | A1 | 12/2010 | Fujioka et al. |
| 2010/0308654 | A1 | 12/2010 | Chen |
| 2010/0311365 | A1 | 12/2010 | Vinayak et al. |
| 2010/0321127 | A1 | 12/2010 | Watanabe et al. |
| 2011/0018626 | A1 | 1/2011 | Kojima |
| 2011/0084760 | A1 | 4/2011 | Guo et al. |
| 2011/0148375 | A1 | 6/2011 | Tsuji |
| 2011/0234182 | A1 | 9/2011 | Wilson |
| 2011/0235827 | A1 | 9/2011 | Lesso et al. |
| 2011/0279180 | A1 | 11/2011 | Yamanouchi et al. |
| 2012/0025907 | A1 | 2/2012 | Koo et al. |
| 2012/0025919 | A1 | 2/2012 | Huynh |
| 2012/0034893 | A1 | 2/2012 | Baxter et al. |
| 2012/0068767 | A1 | 3/2012 | Henshaw et al. |
| 2012/0133299 | A1 | 5/2012 | Capodivacca et al. |
| 2012/0139516 | A1 | 6/2012 | Tsai et al. |
| 2012/0154054 | A1 | 6/2012 | Kaczman et al. |
| 2012/0170334 | A1 | 7/2012 | Menegoli et al. |
| 2012/0176196 | A1 | 7/2012 | Khlat |
| 2012/0194274 | A1 | 8/2012 | Fowers et al. |
| 2012/0236444 | A1 | 9/2012 | Srivastava et al. |
| 2012/0299647 | A1 | 11/2012 | Honjo et al. |
| 2013/0034139 | A1 | 2/2013 | Khlat et al. |
| 2013/0094553 | A1* | 4/2013 | Paek et al. ............... 375/222 |
| 2013/0307617 | A1 | 11/2013 | Khlat et al. |
| 2013/0328613 | A1 | 12/2013 | Kay et al. |
| 2014/0009200 | A1 | 1/2014 | Kay et al. |
| 2014/0009227 | A1 | 1/2014 | Kay et al. |

FOREIGN PATENT DOCUMENTS

| | | |
|---|---|---|
| EP | 1569330 A1 | 8/2005 |
| EP | 2214304 A1 | 8/2010 |
| EP | 2244366 A1 | 10/2010 |
| GB | 2462204 A | 2/2010 |
| GB | 2465552 A | 5/2010 |
| GB | 2484475 A | 4/2012 |
| WO | 0048306 A1 | 8/2000 |
| WO | 04002006 A1 | 12/2003 |
| WO | 2004082135 A2 | 9/2004 |
| WO | 2005013084 A2 | 2/2005 |
| WO | 2006073208 A1 | 7/2006 |
| WO | 2007107919 A1 | 9/2007 |
| WO | 2007149346 A2 | 12/2007 |

OTHER PUBLICATIONS

Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.

Kim, N. et al, "Ripple feedback filter suitable for analog/digital mixed-mode audio amplifier for improved efficiency and stability," 33rd Annual Power Electronics Specialists Conference, vol. 1, Jun. 23, 2002, pp. 45-49.

Kim et al., "High Efficiency and Wideband Envelope Tracking Power Amplifier with Sweet Spot Tracking," 2010 IEEE Radio Frequency Integrated Circuits Symposium, May 23-25, 2010, pp. 255-258.

Knutson, P, et al., "An Optimal Approach to Digital Raster Mapper Design," 1991 IEEE Transactions on Consumer Electronics held Jun. 5-7, 1991, vol. 37, Issue 4, published Nov. 1991, pp. 746-752.

Le, Hanh-Phuc et al., "A 32nm Fully Integrated Reconfigurable Switched-Capacitor DC-DC Convertor Delivering $0.55W/mm^2$ at 81% Efficiency," 2010 IEEE International Solid State Circuits Conference, Feb. 7-11, 2010, pp. 210-212.

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.

Unknown, "Nujira files 100th envelope tracking patent," CS: Compound Semiconductor, Apr. 11, 2011, 1 page.

Non-final Office Action for U.S. Appl. No. 12/112,006 mailed Apr. 5, 2010, now Patent No. 7,884,681, 6 pages.

Notice of Allowance for U.S. Appl. No. 12/112,006 mailed Jul. 19, 2010, 6 pages.

International Search Report for PCT/US11/033037 mailed Aug. 9, 2011, 10 pages.

International Search Report for PCT/US2011/044857 mailed Oct. 24, 2011, 10 pages.

International Search Report for PCT/US11/49243 mailed Dec. 22, 2011, 9 pages.

International Search Report for PCT/US2011/064255 mailed Apr. 3, 2012, 12 pages.

Non-final Office Action for U.S. Appl. No. 11/113,873, now Patent No. 7,773,691 mailed Feb. 1, 2008, 17 pages.

Final Office Action for U.S. Appl. No. 11/113,873, now Patent No. 7,773,691, mailed Jul. 30, 2008, 19 pages.

Non-final Office Action for U.S. Appl. No. 11/113,873, now Patent No. 7,773,691, mailed Nov. 26, 2008, 22 pages.

Final Office Action for U.S. Appl. No. 11/113,873, now Patent No. 7,773,691, mailed May 4, 2009, 20 pages.

Non-final Office Action for U.S. Appl. 11/113,873, now Patent No. 7,773,691, mailed Feb. 3, 2010, 21 pages.

Notice of Allowance for U.S. Appl. No. 11/113,873, now Patent No. 7,773,691, mailed Jun. 9, 2010, 7 pages.

International Search Report for PCT/US06/12619 mailed May 8, 2007, 2 pages.

Extended European Search Report for application 06740532.4 mailed Dec. 7, 2010, 7 pages.

International Search Report for PCT/US2011/061009 mailed Feb. 8, 2012, 14 pages.

International Search Report for PCT/US2012/023495 mailed May 7, 2012, 13 pages.

Invitation to Pay Additional Fees and Where Applicable Protest Fee for PCT/US2011/061007 mailed Feb. 13, 2012, 7 pages.

Hekkala, A. et al., "Adaptive time misalignment compensation in envelope tracking amplifiers," International Symposium on Spread Spectrum Techniques and Applications, Aug. 2008, pp. 761-765.

Invitation to Pay Additional Fees and Where Applicable Protest Fee for PCT/US2012/024124 mailed Jun. 1, 2012, 7 pages.

Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.

Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.

International Search Report for PCT/US2011/061007 mailed Aug. 16, 2012, 16 pages.

International Search Report for PCT/US2012/024124 mailed Aug. 24, 2012, 14 pages.

International Preliminary Report on Patentability for PCT/US2012/024124, mailed Aug. 22, 2013, 8 pages.

International Preliminary Report on Patentability for PCT/US2012/023495, mailed Aug. 15, 2013, 10 pages.

Notice of Allowance for U.S. Appl. No. 13/188,024, mailed Jun. 18, 2013, 7 pages.

International Preliminary Report on Patentability for PCT/US2011/054106 mailed Apr. 11, 2013, 8 pages.

(56) References Cited

OTHER PUBLICATIONS

International Preliminary Report on Patentability for PCT/US2011/061007 mailed May 30, 2013, 11 pages.
International Preliminary Report on Patentability for PCT/US2011/061009 mailed May 30, 2013, 10 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
International Preliminary Report on Patentability for PCT/US2011/044857 mailed Mar. 7, 2013, 6 pages.
Notice of Allowance for U.S. Appl. No. 13/218,400 mailed Apr. 11, 2013, 7 pages.
Non-Final Office Action for U.S. Appl. No. 13/297,470 mailed May 8, 2013, 15 pages.
Notice of Allowance for U.S. Appl. No. 13/222,453 mailed Feb. 21, 2013, 7 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/067230 mailed Feb. 21, 2013, 10 pages.
International Search Report for PCT/US2011/054106 mailed Feb. 9, 2012, 11 pages.
International Search Report for PCT/US12/40317 mailed Sep. 7, 2012, 7 pages.
International Search Report for PCT/US2012/046887 mailed Dec. 21, 2012, 12 pages.
Non-Final Office Action for U.S. Appl. No. 13/188,024, mailed Feb. 5, 2013, 8 pages.
International Search Report and Written Opinion for PCT/US2012/062070, mailed Jan. 21, 2013, 12 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
International Preliminary Report on Patentability for PCT/US11/49243 mailed Nov. 13, 2012, 33 pages.
Non-final Office Action for U.S. Appl. No. 13/089,917 mailed Nov. 23, 2012, 6 pages.
Non final Office Action for U.S. Appl. No. 13/222,453 mailed Dec. 6, 2012, 13 pages.
International Preliminary Report on Patentability for PCT/US2011/033037 mailed Oct. 23, 2012, 7 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.
Non-Final Office Action for U.S. Appl. No. 12/836,307, mailed Nov. 5, 2013, 6 pages.
Examination Report for European Patent Application No. 11720630, mailed Aug. 16, 2013, 5 pages.
Notice of Allowance for U.S. Appl. No. 13/531,719, mailed Dec. 30, 2013, 7 pages.
Non-Final Office Action for U.S. Appl. No. 14/022,940, mailed Dec. 20, 2013, 5 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
International Preliminary Report on Patentability for PCT/US2012/040317, mailed Dec. 12, 2013, 5 pages.
International Search Report and Written Opinion for PCT/US2013/052277, mailed Jan. 7, 2014, 14 pages.
Notice of Allowance for U.S. Patent Application No. 13/297,490, mailed Feb. 27, 2014, 7 pages.
Non-Final Office Action for U.S. Patent Application No. 13/297,470, mailed Feb. 20, 2014, 16 pages.
Non-Final Office Action for U.S. Patent Application No. 13/661,552, mailed Feb. 21, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
International Search Report and Written Opinion for PCT/US2013/065403, mailed Feb. 5, 2014, 11 pages.
Examination Report for European Patent Application No. 11720630.0 issued Mar. 18, 2014, 4 pages.
International Search Report and Written Opinion for PCT/US2012/062110 issued Apr. 8, 2014, 12 pages.
International Preliminary Report on Patentability for PCT/US2012/062070 mailed May 8, 2014, 8 pages.
International Preliminary Report on Patentability for PCT/US2012/062110 mailed May 8, 2014, 9 pages.
Notice of Allowance for U.S. Patent Application No. 12/836,307 mailed May 5, 2014, 6 pages.
Non-Final Office Action for U.S. Patent Application No. 13/367,973 mailed Apr. 25, 2014, 5 pages.
Non-Final Office Action for U.S. Patent Application No. 13/647,815 mailed May 2, 2014, 6 pages.
Non-Final Office Action for U.S. Patent Application No. 13/689,883 mailed Mar. 27, 2014, 13 pages.
Non-Final Office Action for U.S. Patent Application No. 13/692,084 mailed Apr. 10, 2014, 6 pages.
Non-Final Office Action for U.S. Patent Application No. 13/684,826 mailed Apr. 3, 2014, 5 pages.
Non-Final Office Action for U.S. Patent Application No. 13/951,976 mailed Apr. 4, 2014, 7 pages.
Non-Final Office Action for U.S. Patent Application No. 13/714,600 mailed May 9, 2014, 14 pages.
Notice of Allowance for U.S. Patent Application No. 14/022,858 mailed May 27, 2014, 6 pages.

* cited by examiner

MODIFIED SWITCHING RIPPLE FOR ENVELOPE TRACKING SYSTEM

RELATED APPLICATIONS

This application claims the benefit of U.S. provisional patent application No. 61/508,202, filed Jul. 15, 2011, the disclosure of which is incorporated herein by reference in its entirety.

FIELD OF THE DISCLOSURE

Embodiments of the present disclosure relate to switching power supplies and radio frequency (RF) power amplifiers, both of which may be used in RF communication systems.

BACKGROUND

Cellular communications bands are often adjacent to non-cellular communications bands. As such, interference between the cellular communications bands and the non-cellular communications bands needs to be minimized for the corresponding cellular and the non-cellular systems to operate properly and efficiently. For example, RF emissions from cellular communications signals that bleed into a non-cellular communications band must be low enough to prevent problems in the corresponding non-cellular communications system. Such RF emissions may be called RF spectral emissions since these emissions fall outside of a desired RF spectrum associated with a corresponding cellular communications signal.

The RF spectral emissions from a cellular communications signal may adversely impact the non-cellular communications system. However, when the cellular communications band is adequately separated from the non-cellular communications band, when a magnitude of the cellular communications signal having RF spectral emissions is sufficiently small, when a sensitivity of the corresponding non-cellular communications system to the RF spectral emissions is sufficiently small, or any combination thereof, the cellular communications signal may not adversely impact the non-cellular communications system.

In this regard, when the cellular communications band is about adjacent to the non-cellular communications band and the non-cellular communications system is sensitive to the RF spectral emissions, the cellular communications system must modify the RF spectral emissions to allow the non-cellular communications system to function properly. As such, there is a need for a cellular communications system that is capable of modifying RF spectral emissions to allow a non-cellular communications system to function properly.

SUMMARY

Embodiments of the present relate to radio frequency (RF) transmitter circuitry, which includes an RF power amplifier (PA) and an envelope tracking power supply. The RF PA receives and amplifies an RF input signal to provide an RF transmit signal using an envelope power supply signal. The envelope tracking power supply provides the envelope power supply signal, which has switching ripple. Further, the envelope tracking power supply operates in either a normal switching ripple mode or a modified switching ripple mode, such that during the normal switching ripple mode, the envelope power supply signal has normal switching ripple, and during the modified switching ripple mode, the envelope power supply signal has modified switching ripple. When the modified switching ripple is required, the envelope tracking power supply operates in the modified switching ripple mode.

In one embodiment of the RF transmitter circuitry, the envelope power supply signal provides power for amplification and envelope tracks the RF transmit signal. As such, the switching ripple of the envelope power supply signal may at least partially amplitude modulate the RF transmit signal, thereby adding switching ripple sidebands to the RF transmit signal. Each switching ripple sideband is separated from a frequency of the RF transmit signal by a frequency of the switching ripple. The switching ripple sidebands are RF spectral emissions that may violate communications protocols. If the switching ripple sidebands cause communications protocol violations, the modified switching ripple may be required to eliminate the communications protocol violations.

In one embodiment of the RF transmitter circuitry, the RF transmit signal falls within one of multiple RF communications bands, which includes a first RF communications band. A second RF communications band, which is not included in the multiple RF communications bands, is about adjacent to the first RF communications band. Therefore, when the RF transmit signal falls within the first RF communications band, one of the switching ripple sidebands may extend into the second RF communications band. As such, the modified switching ripple may be required to avoid violating a communications protocol associated with the second RF communications band.

For example, in one embodiment of the RF transmitter circuitry, the second RF communications band is a Public Safety Band, in which spurious emissions must be kept below −60 decibel milliwatts per 6.5 kilohertz (−60 dBm/6.5 KHz) and the first RF communications band is a $3^{rd}$ Generation Partnership Project (3GPP) cellular communications band, in which spurious emissions must be kept below −50 dBm/1 MHz. Therefore, the spurious emissions requirements of the Public Safety Band are much stricter than the spurious emissions requirements of the 3GPP cellular communications band. As a result, in one embodiment of the RF transmitter circuitry, a frequency of the switching ripple is modified to move the switching ripple sideband that extends into the second RF communications band outside of the Public Safety Band, where spurious emissions requirements are less strict. In an alternate embodiment of the RF transmitter circuitry, the envelope tracking power supply uses active ripple cancellation to reduce a magnitude of the switching ripple to meet the spurious emissions requirement. In an additional embodiment of the RF transmitter circuitry, both the frequency of the switching ripple is modified and the active ripple cancellation is used.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
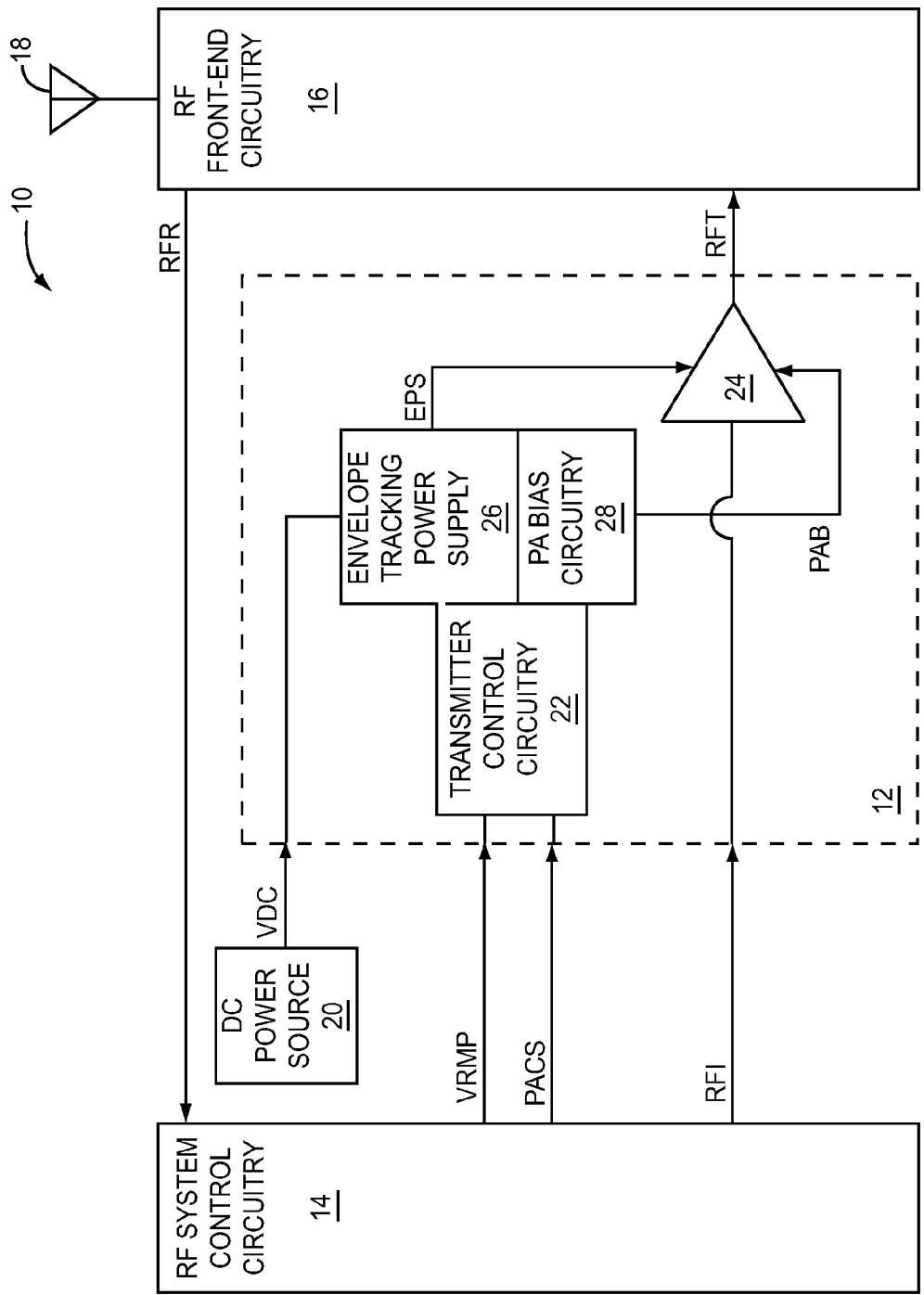
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20. The RF transmitter circuitry 12 includes transmitter control circuitry 22, an RF PA 24, an envelope tracking power supply 26, and PA bias circuitry 28.

In one embodiment of the RF communications system 10, the RF front-end circuitry 16 receives via the RF antenna 18, processes, and forwards an RF receive signal RFR to the RF system control circuitry 14. The RF system control circuitry 14 provides an envelope power supply control signal VRMP and a transmitter configuration signal PACS to the transmitter control circuitry 22. The RF system control circuitry 14 selects either a normal switching ripple mode or a modified switching ripple mode, and the transmitter configuration signal PACS is indicative of the selection of the normal switching ripple mode or the modified switching ripple mode made by the RF system control circuitry 14. The RF system control circuitry 14 provides an RF input signal RFI to the RF PA 24. The DC power source 20 provides a DC source signal VDC to the envelope tracking power supply 26. In one embodiment of the DC power source 20, the DC power source 20 is a battery.

The transmitter control circuitry 22 is coupled to the envelope tracking power supply 26 and to the PA bias circuitry 28. The envelope tracking power supply 26 provides an envelope power supply signal EPS to the RF PA 24 based on the envelope power supply control signal VRMP. The DC source signal VDC provides power to the envelope tracking power supply 26. As such, the envelope power supply signal EPS is based on the DC source signal VDC. The envelope power supply control signal VRMP is representative of a setpoint of the envelope power supply signal EPS. The RF PA 24 receives and amplifies the RF input signal RFI to provide an RF transmit signal RFT using the envelope power supply signal EPS. The envelope power supply signal EPS provides power for amplification. The RF front-end circuitry 16 receives, processes, and transmits the RF transmit signal RFT via the RF antenna 18. In one embodiment of the RF transmitter circuitry 12, the transmitter control circuitry 22 configures the RF transmitter circuitry 12 based on the transmitter configuration signal PACS.

The PA bias circuitry 28 provides a PA bias signal PAB to the RF PA 24. In this regard, the PA bias circuitry 28 biases the RF PA 24 via the PA bias signal PAB. In one embodiment of the PA bias circuitry 28, the PA bias circuitry 28 biases the RF PA 24 based on the transmitter configuration signal PACS. In one embodiment of the RF front-end circuitry 16, the RF front-end circuitry 16 includes at least one RF switch, at least one RF amplifier, at least one RF filter, at least one RF duplexer, at least one RF diplexer, at least one RF amplifier, the like, or any combination thereof. In one embodiment of the RF system control circuitry 14, the RF system control circuitry 14 is RF transceiver circuitry, which may include an RF transceiver IC, baseband controller circuitry, the like, or any combination thereof.

In one embodiment of the RF transmitter circuitry 12, the envelope tracking power supply 26 provides the envelope power supply signal EPS, which has switching ripple. Further, the envelope tracking power supply 26 operates in either the normal switching ripple mode or the modified switching ripple mode, such that during the normal switching ripple mode, the envelope power supply signal EPS has normal switching ripple, and during the modified switching ripple mode, the envelope power supply signal EPS has modified switching ripple. When the modified switching ripple is required, the envelope tracking power supply 26 operates in the modified switching ripple mode.

In one embodiment of the RF transmitter circuitry 12, the envelope power supply signal EPS provides power for amplification and envelope tracks the RF transmit signal RFT. As such, the switching ripple of the envelope power supply signal EPS may at least partially amplitude modulate the RF transmit signal RFT, thereby adding switching ripple sidebands 50 (FIG. 5) to the RF transmit signal RFT. Each switching ripple sideband 50 (FIG. 5) is separated from a frequency of the RF transmit signal RFT by a frequency of the switching ripple. The switching ripple sidebands 50 (FIG. 5) are RF spectral emissions that may violate communications protocols. If the switching ripple sidebands 50 (FIG. 5) cause communications protocol violations, the modified switching ripple may be required to eliminate the communications protocol violations.

Figure 5:
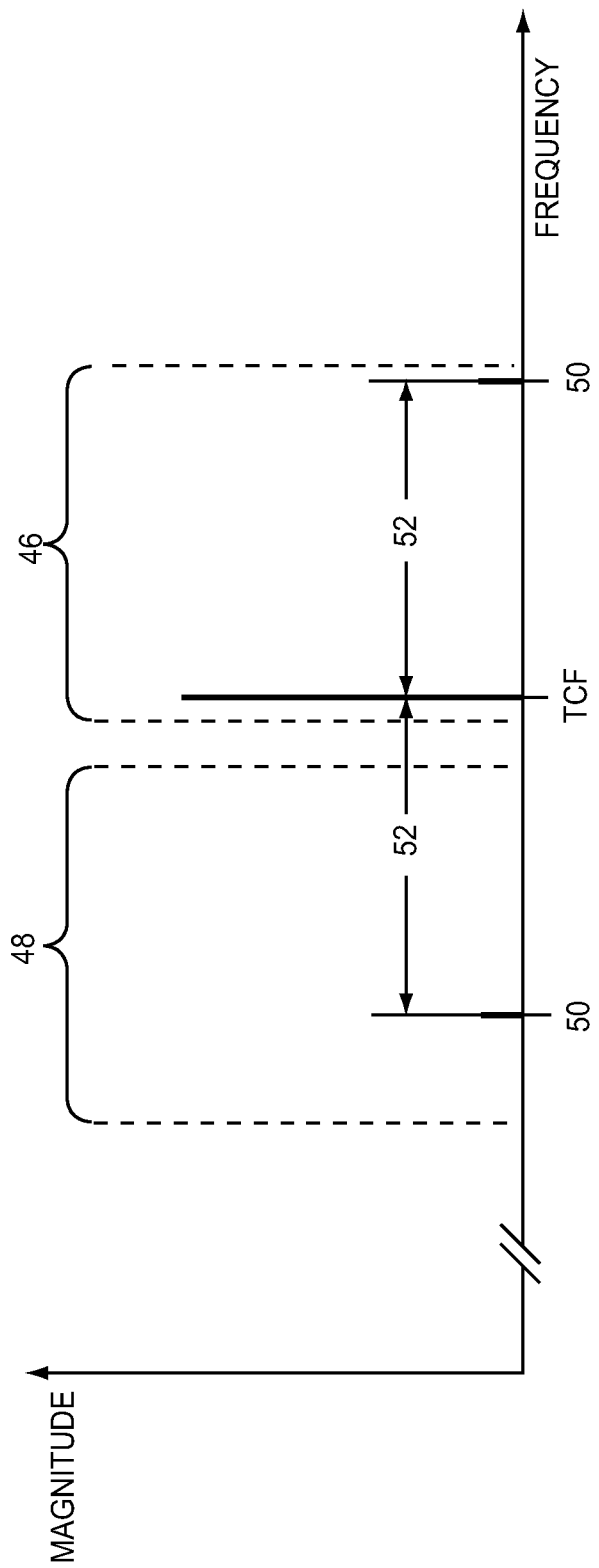
FIG. 5 is a graph illustrating a transmit carrier frequency and switching ripple sidebands of an RF transmit signal illustrated in FIG. 1 relative to a first RF communications band and a second RF communications band during a normal switching ripple mode of the envelope tracking power supply according to a first embodiment of RF transmitter circuitry.

In one embodiment of the RF transmitter circuitry 12, the RF transmit signal RFT falls within one of multiple RF communications bands, which includes a first RF communications band 46 (FIG. 5). A second RF communications band 48 (FIG. 5), which is not included in the multiple RF communications bands, is about adjacent to the first RF communications band 46 (FIG. 5). Therefore, when the RF transmit signal RFT falls within the first RF communications band 46 (FIG. 5), one of the switching ripple sidebands 50 (FIG. 5) may extend into the second RF communications band 48 (FIG. 5). As such, the modified switching ripple may be required to avoid violating a communications protocol associated with the second RF communications band 48 (FIG. 5). In an alternate embodiment of the RF transmitter circuitry 12, when the RF transmit signal RFT falls within the first RF communications band 46 (FIG. 5) and an RF output power from the RF PA 24 is higher than an RF output power threshold, modified switching ripple is required. In this regard, in one embodiment of the RF transmitter circuitry 12, during the modified switching ripple mode, the RF transmit signal RFT falls within the first RF communications band 46 (FIG. 5). In one embodiment of the RF transmitter circuitry 12, when the modified switching ripple is not required, envelope tracking power supply 26 operates in the normal switching ripple mode, such that during the normal switching ripple mode, the envelope power supply signal EPS has normal switching ripple.

In one embodiment of the RF transmitter circuitry 12, the first RF communications band 46 (FIG. 5) is a cellular communications band and the second RF communications band 48 (FIG. 5) is a non-cellular communications band. For example, in one embodiment of the RF transmitter circuitry 12, the second RF communications band 48 (FIG. 5) is a Public Safety Band, in which spurious emissions must be kept below −60 decibel milliwatts per 6.5 kilohertz (−60 dBm/6.5 KHz) and the first RF communications band is a $3^{rd}$ Generation Partnership Project (3GPP) cellular communications band, in which spurious emissions must be kept below −50 dBm/1 MHz. Therefore, the spurious emissions requirements of the Public Safety Band are much stricter than the spurious emissions requirements of the 3GPP cellular communications band. In this regard, in one embodiment of the first RF communications band 46 (FIG. 5), a frequency range of the first RF communications band 46 (FIG. 5) is between about 777 megahertz and about 787 megahertz. In one embodiment of the second RF communications band 48 (FIG. 5), a frequency range of the second RF communications band 48 (FIG. 5) is between about 763 megahertz and about 775 megahertz. As such, the first RF communications band 46 (FIG. 5) is about adjacent to the second RF communications band 48 (FIG. 5).

As a result, in one embodiment of the RF transmitter circuitry 12, during the modified switching ripple mode, the envelope tracking power supply 26 modifies a frequency of the switching ripple to move the switching ripple sideband that extends into the second RF communications band 48 (FIG. 5) outside of the Public Safety Band, where spurious emissions requirements are less strict. In an alternate embodiment of the RF transmitter circuitry 12, during the modified switching ripple mode, the envelope tracking power supply 26 uses active ripple cancellation to reduce a magnitude of the switching ripple to meet the spurious emissions requirement. As such, an efficiency of the envelope tracking power supply 26 may be less during the modified switching ripple mode than during the normal switching ripple mode. In an additional embodiment of the RF transmitter circuitry 12, during the modified switching ripple mode, both the frequency of the switching ripple is modified and the active ripple cancellation is used.

Figure 2:
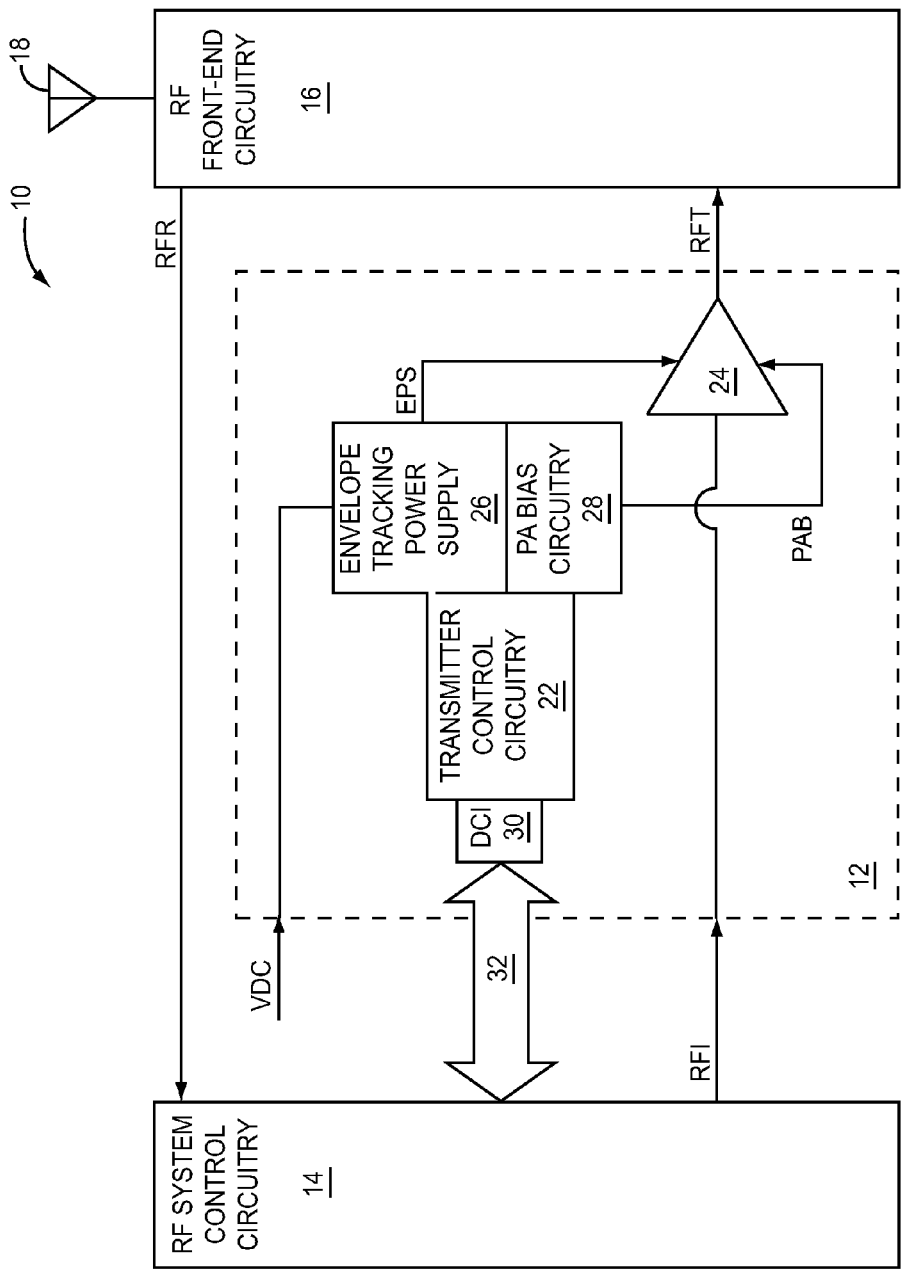
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1, except in the RF communications system 10 illustrated in FIG. 2, the RF transmitter circuitry 12 further includes a digital communications interface 30, which is coupled between the transmitter control circuitry 22 and a digital communications bus 32. The digital communications bus 32 is also coupled to the RF system control circuitry 14. As such, the RF system control circuitry 14 provides the envelope power supply control signal VRMP (FIG. 1) and the transmitter configuration signal PACS (FIG. 1) to the transmitter control circuitry 22 via the digital communications bus 32 and the digital communications interface 30.

Figure 3:
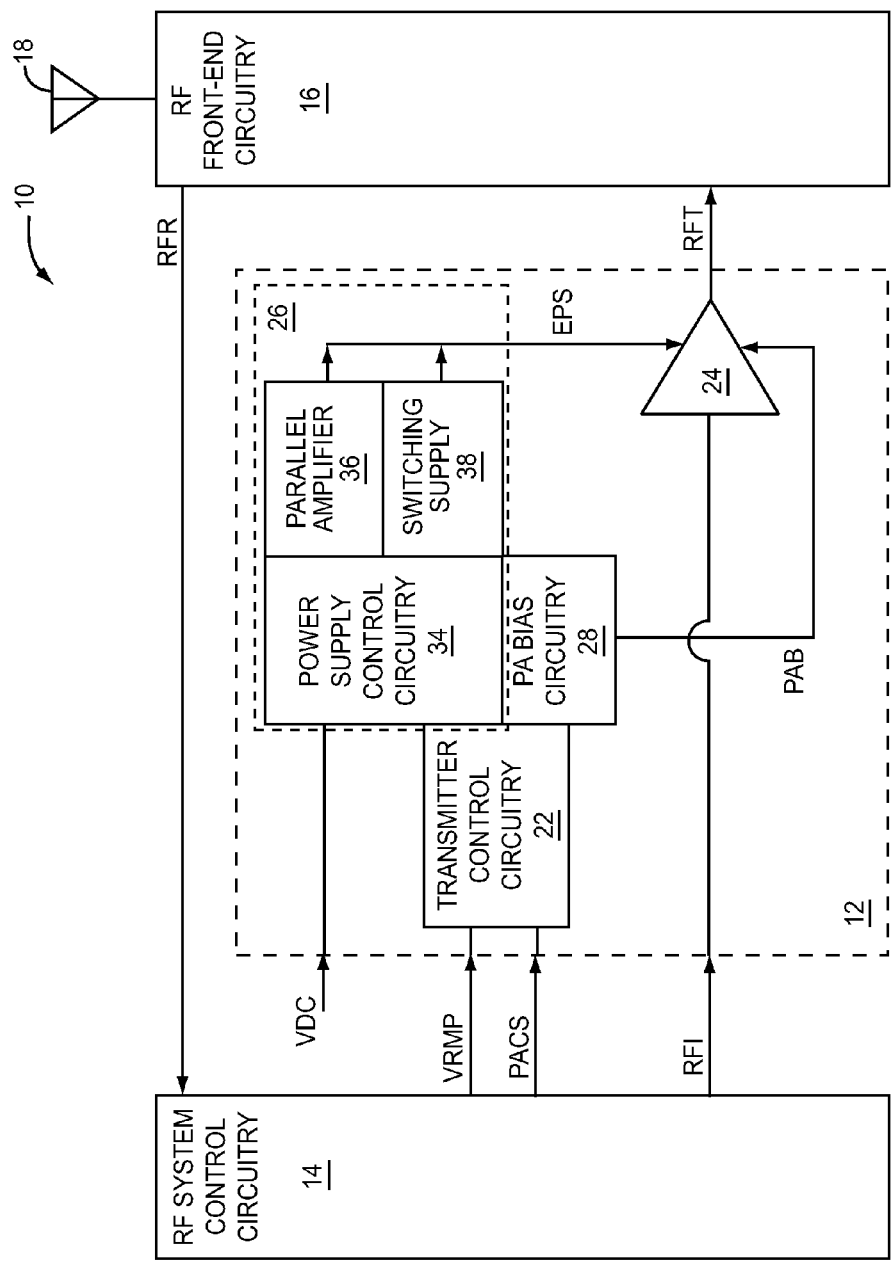
FIG. 3 shows details of an envelope tracking power supply illustrated in FIG. 1 according to one embodiment of the envelope tracking power supply.

FIG. 3 shows details of the envelope tracking power supply 26 illustrated in FIG. 1 according to one embodiment of the envelope tracking power supply 26. The envelope tracking power supply 26 includes power supply control circuitry 34, a parallel amplifier 36, and a switching supply 38. The power supply control circuitry 34 controls the parallel amplifier 36 and the switching supply 38. The parallel amplifier 36 and the switching supply 38 provide the envelope power supply signal EPS, such that the parallel amplifier 36 partially provides the envelope power supply signal EPS and the switching supply 38 partially provides the envelope power supply signal EPS. The switching supply 38 may provide power more efficiently than the parallel amplifier 36. However, the parallel amplifier 36 may provide the envelope power supply signal EPS more accurately than the switching supply 38. As such, the parallel amplifier 36 regulates a voltage of the envelope power supply signal EPS based on the setpoint of the envelope power supply signal EPS, and the switching supply 38 operates to drive an output current from the parallel amplifier 36 toward zero to maximize efficiency. In this regard, the parallel amplifier 36 behaves like a voltage source and the switching supply 38 behaves like a current source.

In one embodiment of the RF transmitter circuitry 12, during the modified switching ripple mode, the envelope tracking power supply 26 uses the active ripple cancellation to reduce a magnitude of the switching ripple. In one embodiment of the active ripple cancellation, the active ripple cancellation relies on an increase in bandwidth of the parallel amplifier 36. As such, a bandwidth of the parallel amplifier 36 is greater during the modified switching ripple mode than during the normal switching ripple mode. However, by increasing the bandwidth of the parallel amplifier 36, efficiency of the envelope tracking power supply 26 may be reduced.

Figure 4:
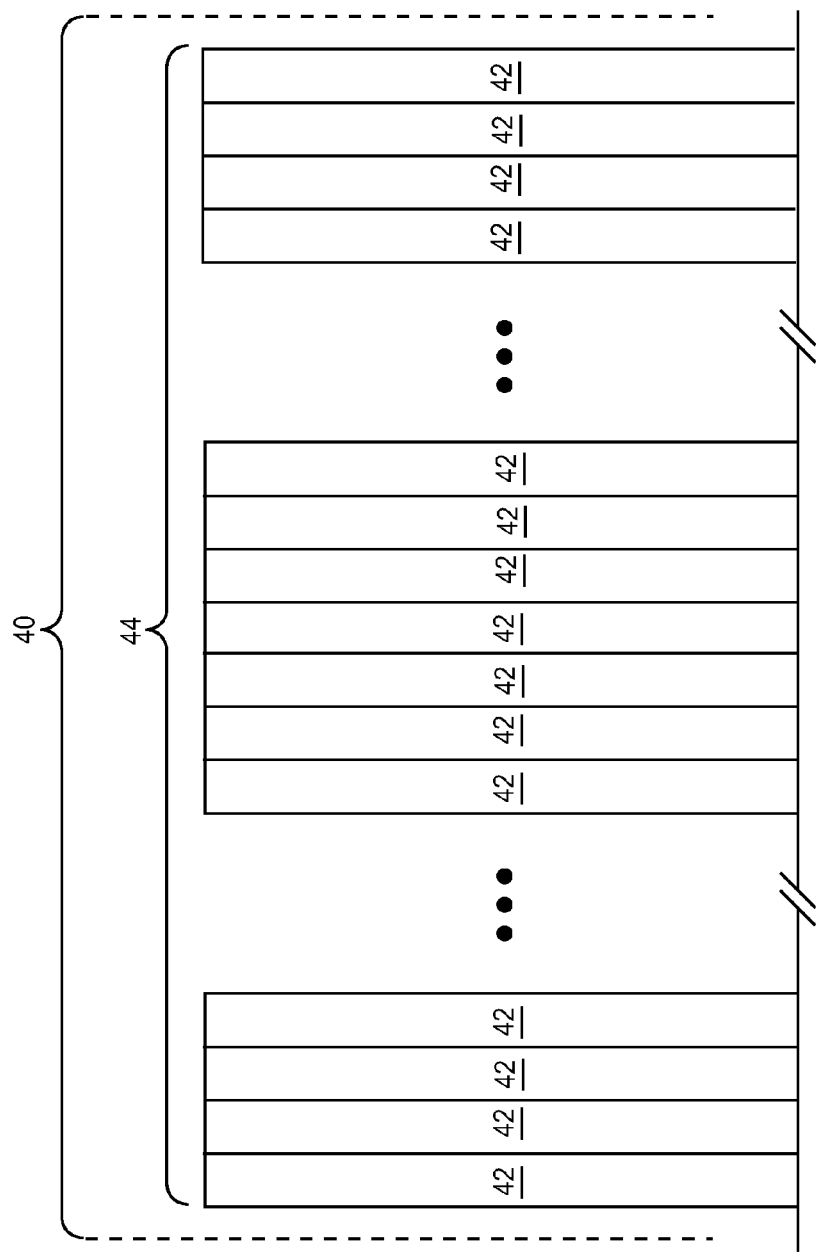
FIG. 4 is a graph illustrating a transmission channel of an RF transmit signal illustrated in FIG. 1 according to one embodiment of the RF communications system.

FIG. 4 is a graph illustrating a transmission channel of the RF transmit signal RFT illustrated in FIG. 1 according to one embodiment of the RF communications system 10. The transmission channel illustrated in FIG. 1 may be associated with a Long Term Evolution (LTE) communications protocol. The transmission channel has a transmission channel bandwidth 40. Multiple resource blocks 42 divide a maximum transmission bandwidth 44 of the transmission channel into equal portions. As such, when transmitting data that does not require the maximum transmission bandwidth 44, a portion of the resource blocks 42 may be inactive. Therefore, only the contiguous resource blocks 42 that are needed to provide required transmission bandwidth are active. In this regard, the bandwidth of the envelope of the RF transmit signal RFT (FIG. 1), the bandwidth of the envelope of the RF input signal RFI (FIG. 1), and the envelope power supply signal bandwidth may be determined by identifying the active resource blocks 42.

FIG. 5 is a graph illustrating a transmit carrier frequency TCF and the switching ripple sidebands 50 of the RF transmit signal RFT (FIG. 1) relative to the first RF communications band 46 and the second RF communications band 48 during the normal switching ripple mode of the envelope tracking power supply 26 (FIG. 1) according to a first embodiment of the RF transmitter circuitry 12 (FIG. 1). The RF transmit signal RFT (FIG. 1) falls within the first RF communications band 46. Therefore, the transmit carrier frequency TCF falls within a lower end of the first RF communications band 46, as shown. One of the switching ripple sidebands 50 falls within the first RF communications band 46 and one of the switching ripple sidebands 50 falls within the second RF communications band 48, as shown. The switching ripple sidebands 50 are separated from the transmit carrier frequency TCF by a frequency difference 52, which is based on the frequency of the normal switching ripple. Having one of the switching ripple sidebands 50 fall within the second RF communications band 48 is problematic, as previously discussed. Therefore, modified switching ripple is required.

Figure 6:
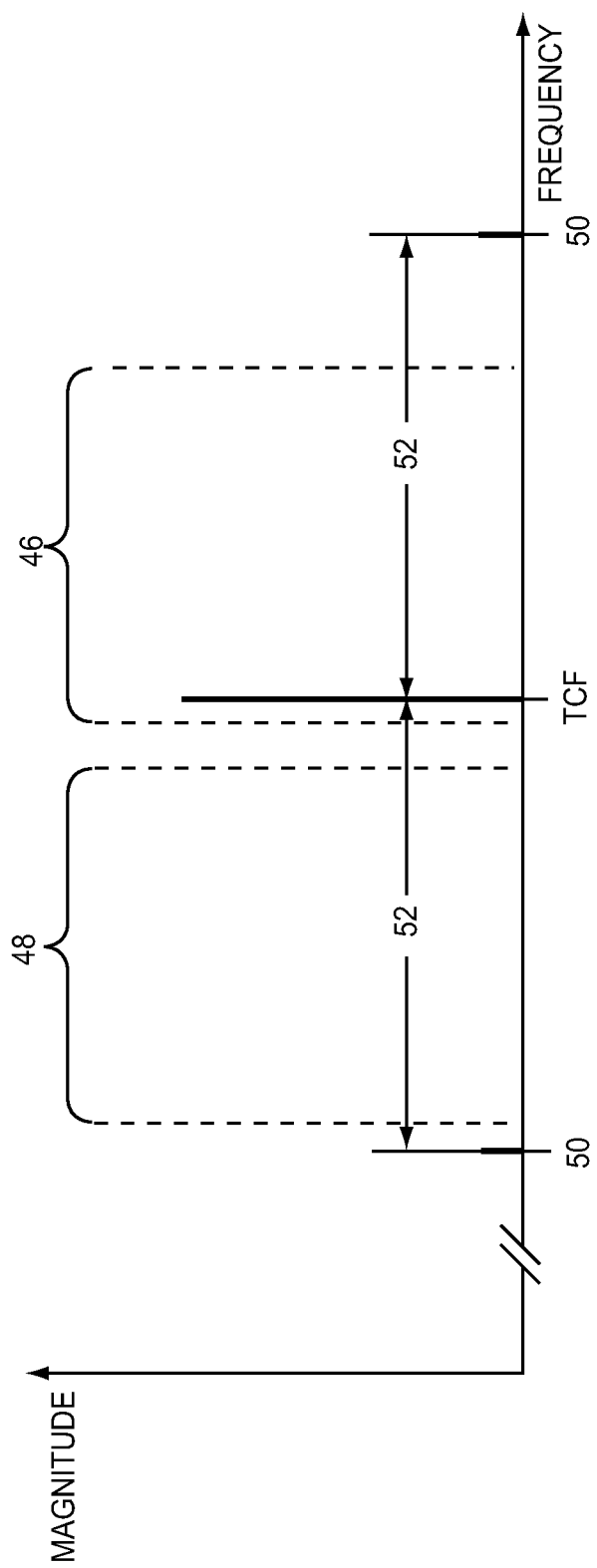
FIG. 6 is a graph illustrating the transmit carrier frequency and switching ripple sidebands of the RF transmit signal illustrated in FIG. 1 relative to the first RF communications band and the second RF communications band during a modified switching ripple mode of the envelope tracking power supply according to the first embodiment of RF transmitter circuitry.

FIG. 6 is a graph illustrating the transmit carrier frequency TCF and the switching ripple sidebands 50 of the RF transmit signal RFT (FIG. 1) relative to the first RF communications band 46 and the second RF communications band 48 during the modified switching ripple mode of the envelope tracking power supply 26 (FIG. 1) according to the first embodiment of the RF transmitter circuitry 12 (FIG. 1). The frequency of the switching ripple is higher during the modified switching ripple mode than during the normal switching ripple mode. Therefore, the graph illustrated in FIG. 6 is similar to the graph illustrated in FIG. 5, except in the graph illustrated in FIG. 6, during the modified switching ripple mode, the switching ripple sidebands 50 fall outside of the second RF communications band 48.

Figure 7:
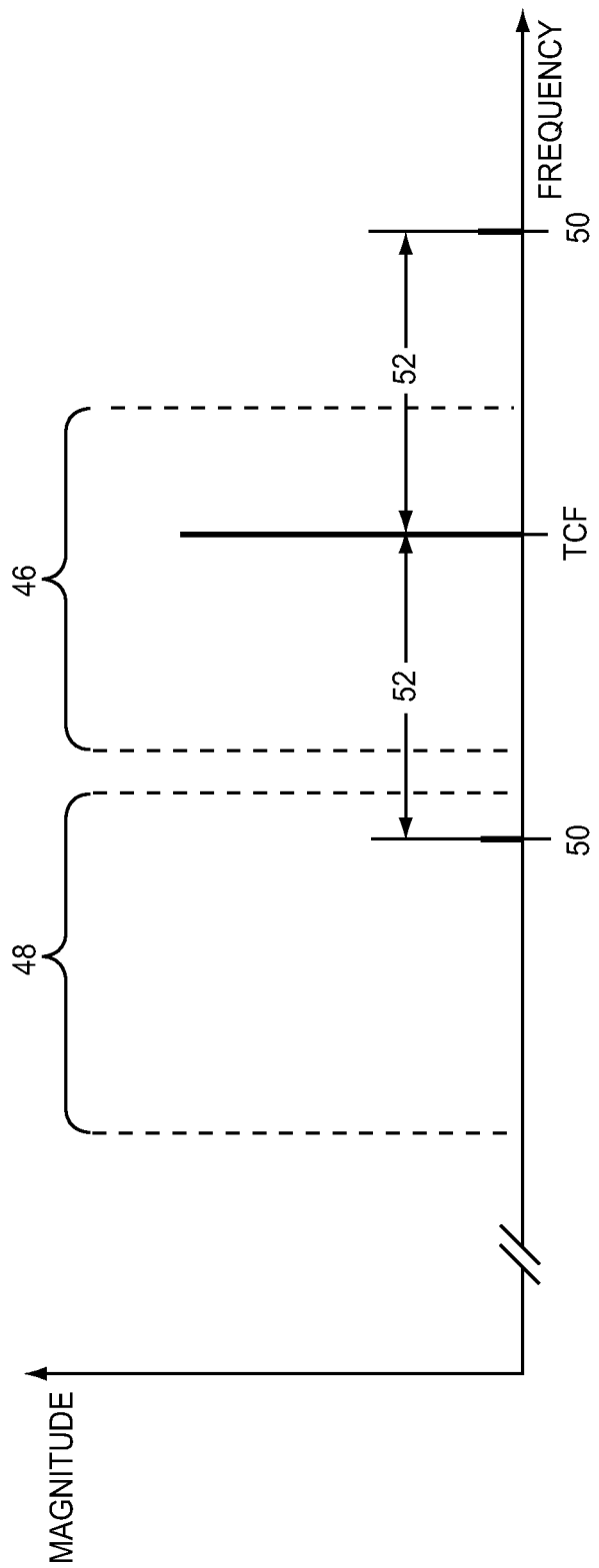
FIG. 7 is a graph illustrating the transmit carrier frequency and switching ripple sidebands of the RF transmit signal illustrated in FIG. 1 relative to the first RF communications band and the second RF communications band during the normal switching ripple mode of the envelope tracking power supply according to a second embodiment of RF transmitter circuitry.

FIG. 7 is a graph illustrating the transmit carrier frequency TCF and the switching ripple sidebands 50 of the RF transmit signal RFT (FIG. 1) relative to the first RF communications band 46 and the second RF communications band 48 during the normal switching ripple mode of the envelope tracking power supply 26 (FIG. 1) according to a second embodiment of the RF transmitter circuitry 12 (FIG. 1). The RF transmit signal RFT (FIG. 1) falls within the first RF communications band 46. Therefore, the transmit carrier frequency TCF falls within a higher end of the first RF communications band 46, as shown. One of the switching ripple sidebands 50 falls outside the first RF communications band 46 and one of the switching ripple sidebands 50 falls within the second RF communications band 48, as shown. The switching ripple sidebands 50 are separated from the transmit carrier frequency TCF by the frequency difference 52, which is based on the frequency of the normal switching ripple. Having one of the switching ripple sidebands 50 fall within the second RF communications band 48 is problematic, as previously discussed. Therefore, modified switching ripple is required.

Figure 8:
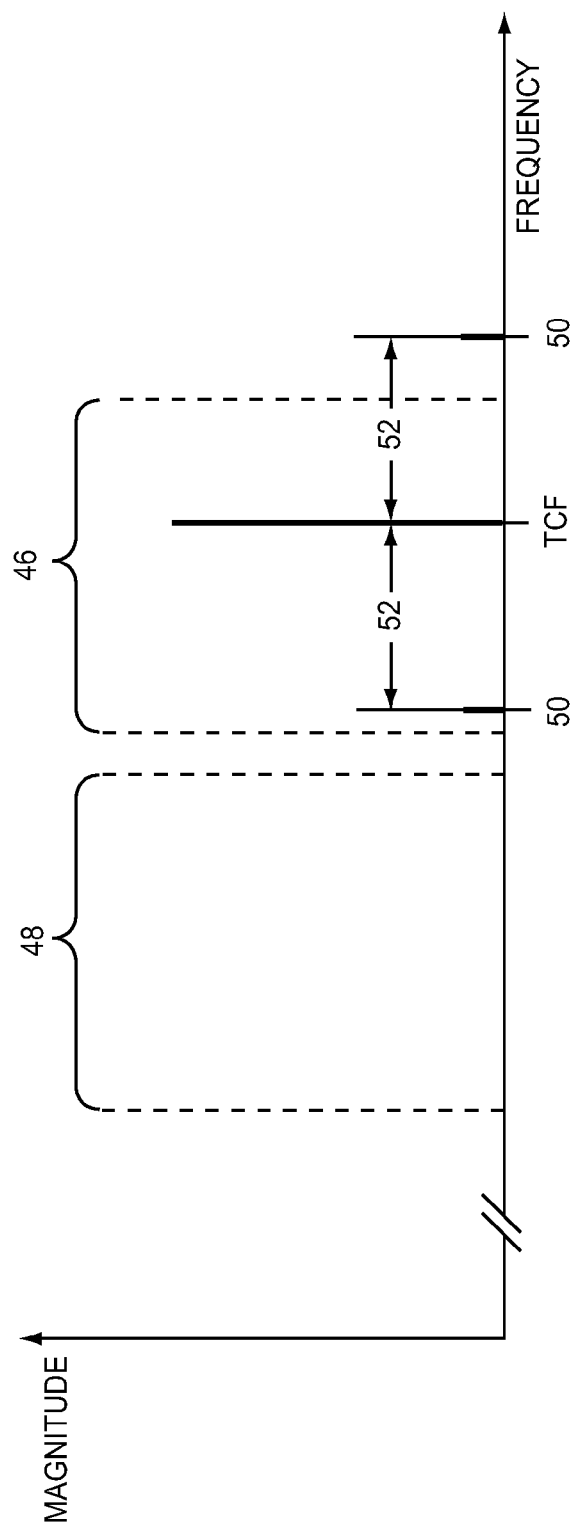
FIG. 8 is a graph illustrating the transmit carrier frequency and switching ripple sidebands of the RF transmit signal illustrated in FIG. 1 relative to the first RF communications band and the second RF communications band during the modified switching ripple mode of the envelope tracking power supply according to the second embodiment of RF transmitter circuitry.

FIG. 8 is a graph illustrating the transmit carrier frequency TCF and the switching ripple sidebands 50 of the RF transmit signal RFT (FIG. 1) relative to the first RF communications band 46 and the second RF communications band 48 during the modified switching ripple mode of the envelope tracking power supply 26 (FIG. 1) according to the second embodiment of the RF transmitter circuitry 12 (FIG. 1). The frequency of the switching ripple is lower during the modified switching ripple mode than during the normal switching ripple mode. Therefore, the graph illustrated in FIG. 8 is similar to the graph illustrated in FIG. 7, except in the graph illustrated in FIG. 8, during the modified switching ripple mode, the switching ripple sidebands 50 fall outside of the second RF communications band 48. Further, one of the switching ripple sidebands 50 falls inside of the first RF communications band 46.

Figure 9:
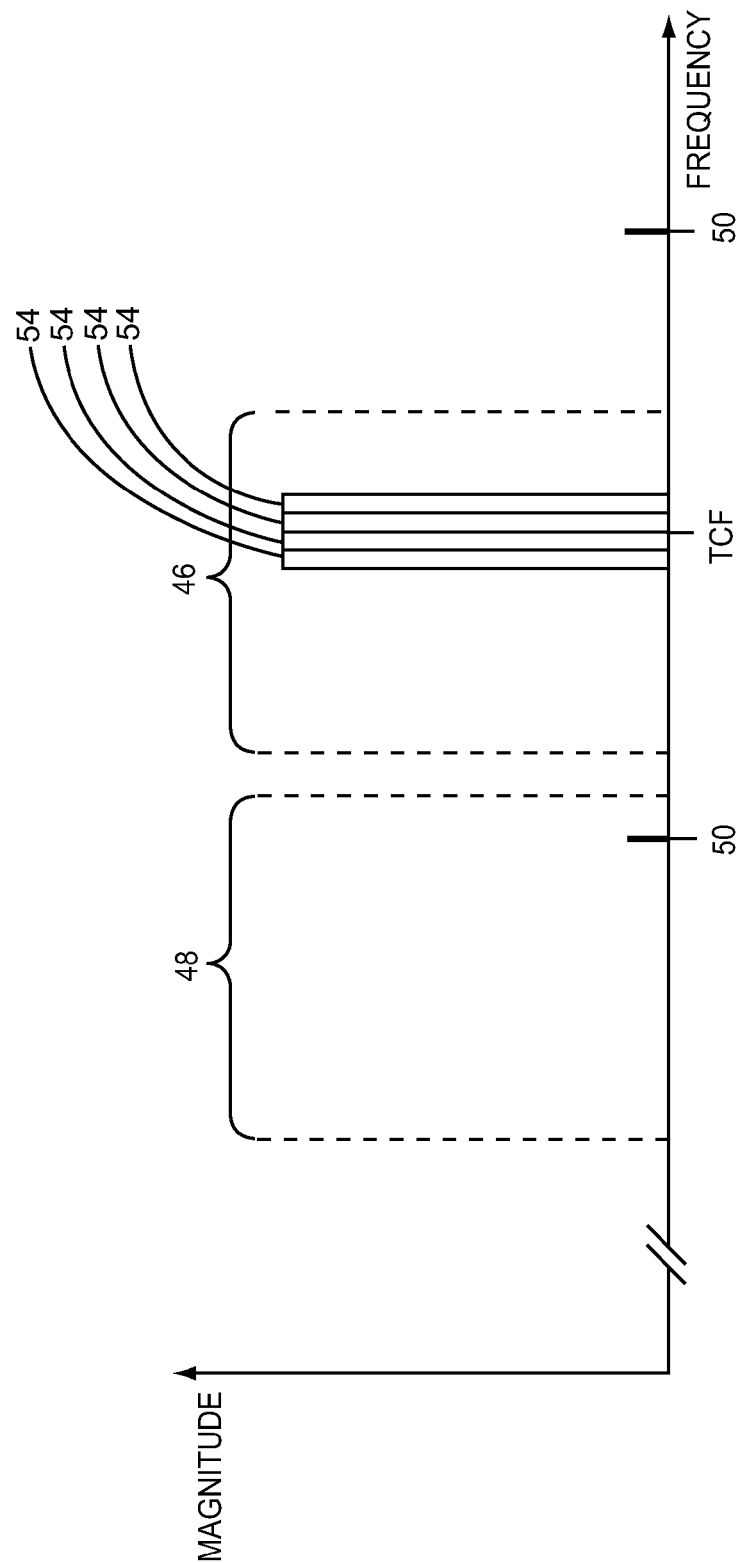
FIG. 9 is a graph illustrating the transmit carrier frequency of the RF transmit signal, the switching ripple sidebands of the RF transmit signal, and active resource blocks of the first RF communications band relative to the first RF communications band and the second RF communications band according to the second embodiment of the RF transmitter circuitry.

FIG. 9 is a graph illustrating the transmit carrier frequency TCF of the RF transmit signal RFT (FIG. 1), the switching ripple sidebands 50 of the RF transmit signal RFT (FIG. 1), and active resource blocks 54 of the first RF communications band 46 relative to the first RF communications band 46 and the second RF communications band 48 according to the second embodiment of the RF transmitter circuitry 12 (FIG. 1). The graph illustrated in FIG. 9 is similar to the graph illustrated in FIG. 7, except in the graph illustrated in FIG. 9, active resource blocks 54 of the first RF communications band 46 overlay the transmit carrier frequency TCF. The location and the number of active resource blocks 54 in the first RF communications band 46 are used to determine the frequency of the switching ripple that is needed to move the switching ripple sidebands 50 such that the switching ripple sidebands 50 fall outside of the second RF communications band 48. Therefore, in one embodiment of the RF transmitter circuitry 12 (FIG. 1), during the modified switching ripple mode, the frequency of the switching ripple is based on the location and the number of active resource blocks 54 in the first RF communications band 46.

Figure 10:
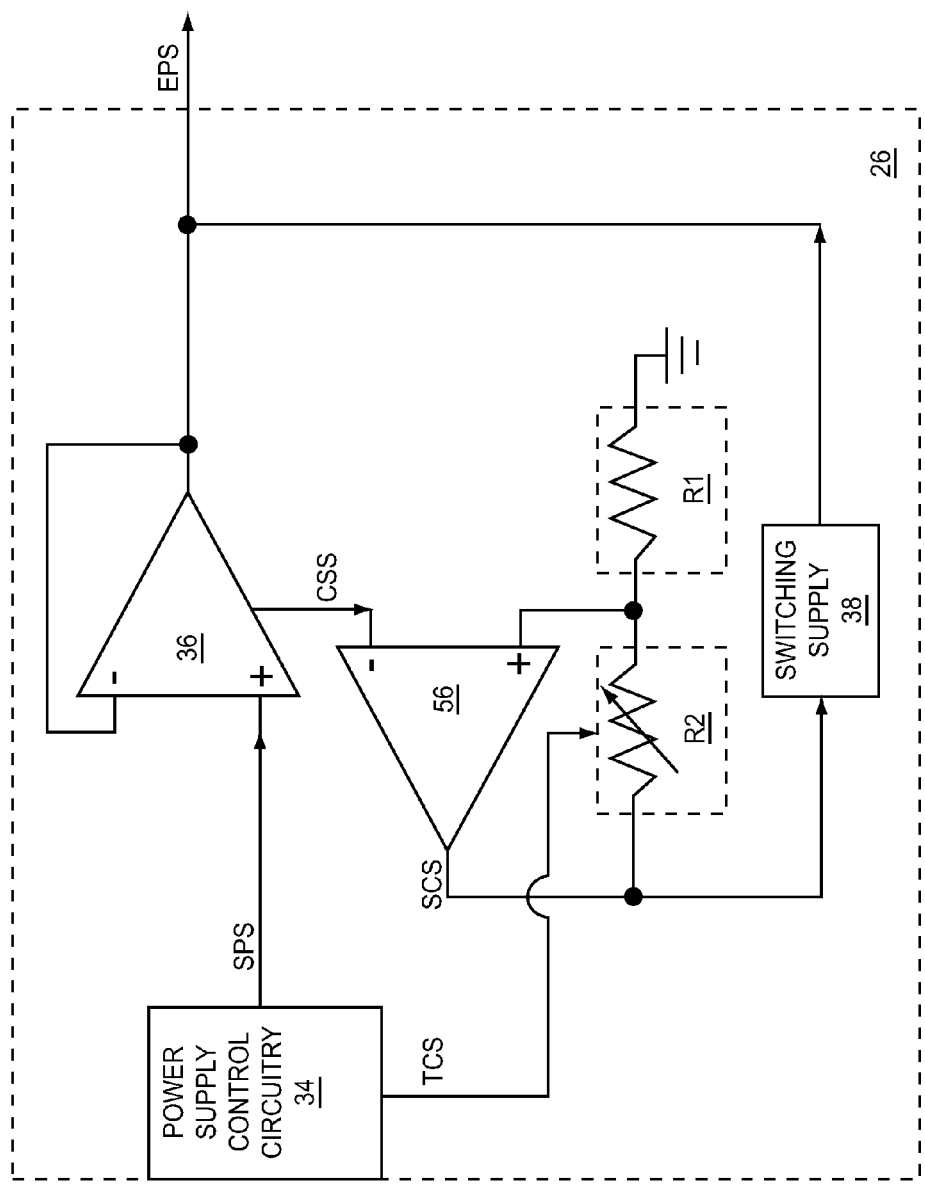
FIG. 10 shows details of the envelope tracking power supply illustrated in FIG. 3 according to one embodiment of the envelope tracking power supply.

FIG. 10 shows details of the envelope tracking power supply 26 illustrated in FIG. 3 according to one embodiment of the envelope tracking power supply 26. The envelope tracking power supply 26 illustrated in FIG. 10 includes the power supply control circuitry 34, the parallel amplifier 36, the switching supply 38, a comparator 56, a first resistive element R1, and a second resistive element R2. The first resistive element R1 is a fixed resistive element, which is coupled between a ground and a non-inverting input to the comparator 56. The second resistive element R2, which is a variable resistive element, is coupled between the non-inverting input to the comparator 56 and an output from the comparator 56. The output from the comparator 56 provides a switching clock signal SCS to the switching supply 38. The power supply control circuitry 34 provides a threshold control signal TCS to the second resistive element R2, such that a resistance of the second resistive element R2 is based on the threshold control signal TCS. The threshold control signal TCS is based on which of the normal switching ripple mode and the modified switching ripple mode is selected.

The power supply control circuitry 34 provides a setpoint signal SPS to the parallel amplifier 36. An inverting input to the parallel amplifier 36 is coupled to an output from the parallel amplifier 36. The parallel amplifier 36 provides a current sense signal CSS to an inverting input to the comparator 56. The parallel amplifier 36 partially provides the envelope power supply signal EPS and the switching supply 38 partially provides the envelope power supply signal EPS. The parallel amplifier 36 regulates a voltage of the envelope power supply signal EPS based on a voltage setpoint of the envelope power supply signal EPS as provided via the setpoint signal SPS. The switching supply 38 regulates a duty-cycle of the switching clock signal SCS to drive an output current from the parallel amplifier 36 toward zero. A magnitude of the current sense signal CSS is equal to about zero when the output current from the parallel amplifier 36 is equal to about zero. The switching clock signal SCS swings between a maximum positive value and a maximum negative value as the current sense signal CSS swings positive and negative.

When the switching supply 38 is building current in an internal inductive element (not shown), the switching clock signal SCS is negative, and the output current from the parallel amplifier 36 and the current sense signal CSS are being driven in a negative direction. When a magnitude of the current sense signal CSS drops below a magnitude at the inverting input to the comparator 56, the switching clock signal SCS switches from negative to positive, thereby causing the switching supply 38 to consume current in the internal inductive element (not shown), such that the output current from the parallel amplifier 36 and the current sense signal CSS are being driven in a positive direction.

A voltage divider created by the first resistive element R1 and the second resistive element R2 establishes a working threshold with hysteresis for the comparator 56. As the resistance of the second resistive element R2 is reduced, the hysteresis is increased, which decreases a frequency of the switching clock signal SCS. Conversely, as the resistance of the second resistive element R2 is increased, the hysteresis is reduced, which increases the frequency of the switching clock signal SCS. In this regard, the effective threshold of the comparator 56 is programmable. The frequency of the switching ripple of the envelope power supply signal EPS is about equal to the frequency of the switching clock signal SCS. In this regard, the frequency of the switching ripple of the envelope power supply signal EPS may be adjusted by adjusting the threshold control signal TCS. In general, in one embodiment of the RF transmitter circuitry 12 (FIG. 1), during the modified switching ripple mode, the envelope tracking power supply 26 modifies the frequency of the switching ripple by modifying a comparison between a parallel amplifier output current and a programmable threshold.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
   a radio frequency power amplifier adapted to receive and amplify a radio frequency input signal to provide a radio frequency transmit signal using an envelope power supply signal; and
   an envelope tracking power supply adapted to:
      provide the envelope power supply signal, which has switching ripple;
      operate in one of a normal switching ripple mode and a modified switching ripple mode;
      during the modified switching ripple mode, the envelope power supply signal has modified switching ripple;
      when the modified switching ripple is required, operate in the modified switching ripple mode; and
      during the modified switching ripple mode, modify a frequency of the switching ripple, wherein:
         the radio frequency transmit signal falls within one of a plurality of radio frequency communications bands;
         the plurality of radio frequency communications bands comprises a first radio frequency communications band, which is about adjacent to a second radio frequency communications band; and
         during the modified switching ripple mode, the one of the plurality of radio frequency communications bands is the first radio frequency communications band.

2. The circuitry of claim 1 wherein when the modified switching ripple is not required, the envelope tracking power supply is further adapted to operate in the normal switching ripple mode, such that during the normal switching ripple mode, the envelope power supply signal has normal switching ripple.

3. The circuitry of claim 1 wherein the first radio frequency communications band is a cellular communications band and the second radio frequency communications band is a non-cellular communications band.

4. The circuitry of claim 3 wherein the first radio frequency communications band is a 3rd Generation Partnership Project cellular communications band and the second radio frequency communications band is a Public Safety Band.

5. The circuitry of claim 4 wherein a frequency range of the first radio frequency communications band is between about 777 megahertz and about 787 megahertz, and a frequency range of the second radio frequency communications band is between about 763 megahertz and about 775 megahertz.

6. The circuitry of claim 1 wherein during the modified switching ripple mode, the envelope tracking power supply is further adapted to use active ripple cancellation to reduce a magnitude of the switching ripple.

7. The circuitry of claim 6 wherein an efficiency of the envelope tracking power supply is less during the modified switching ripple mode than during the normal switching ripple mode.

8. The circuitry of claim 6 wherein the envelope tracking power supply comprises a parallel amplifier adapted to partially provide the envelope power supply signal, such that a bandwidth of the parallel amplifier is greater during the modified switching ripple mode than during the normal switching ripple mode.

9. The circuitry of claim 1 wherein during the modified switching ripple mode, the frequency of the switching ripple is based on a location and a number of active resource blocks in the first radio frequency communications band.

10. The circuitry of claim 1 wherein the frequency of the switching ripple is higher during the modified switching ripple mode than during the normal switching ripple mode, such that during the modified switching ripple mode, switching ripple sidebands fall outside of the second radio frequency communications band.

11. The circuitry of claim 1 wherein the frequency of the switching ripple is lower during the modified switching ripple mode than during the normal switching ripple mode, such that during the modified switching ripple mode, switching ripple sidebands fall outside of the second radio frequency communications band.

12. The circuitry of claim 1 wherein the frequency of the switching ripple is higher during the modified switching ripple mode than during the normal switching ripple mode.

13. The circuitry of claim 1 wherein the frequency of the switching ripple is lower during the modified switching ripple mode than during the normal switching ripple mode.

14. The circuitry of claim 1 wherein during the modified switching ripple mode, the envelope tracking power supply is further adapted to modify the frequency of the switching ripple by modifying a comparison between a parallel amplifier output current and a programmable threshold.

15. The circuitry of claim 1 wherein control circuitry is adapted to select the one of the normal switching ripple mode and the modified switching ripple mode.

16. The circuitry of claim 15 wherein radio frequency transceiver circuitry comprises the control circuitry.

17. The circuitry of claim 15 further comprising the control circuitry.

18. The circuitry of claim 15 further comprising transmitter control circuitry, such that the control circuitry is further adapted to provide a transmitter configuration signal to the transmitter control circuitry, such that the transmitter configuration signal is indicative of the one of the normal switching ripple mode and the modified switching ripple mode.

19. The circuitry of claim 1 wherein
when a radio frequency output power from the radio frequency power amplifier is higher than a radio frequency output power threshold, the modified switching ripple is required.

20. A method comprising:
receiving and amplifying a radio frequency input signal to provide a radio frequency transmit signal using an envelope power supply signal;
providing the envelope power supply signal, which has switching ripple;
operating in one of a normal switching ripple mode and a modified switching ripple mode, such that during the modified switching ripple mode, the envelope power supply signal has modified switching ripple;
when the modified switching ripple is required, operating in the modified switching ripple mode; and
during the modified switching ripple mode, modifying a frequency of the switching ripple, wherein:
the radio frequency transmit signal falls within one of a plurality of radio frequency communications bands;
the plurality of radio frequency communications bands comprises a first radio frequency communications band, which is about adjacent to a second radio frequency communications band; and
during the modified switching ripple mode, the one of the plurality of radio frequency communications bands is the first radio frequency communications band.

* * * * *